(12) United States Patent
Hirai et al.

(10) Patent No.: US 7,467,956 B2
(45) Date of Patent: Dec. 23, 2008

(54) BOARD CONNECTOR

(75) Inventors: Hiroki Hirai, Yokkaichi (JP); Kenji Okamura, Yokkaichi (JP); Masahide Hio, Yokkaichi (JP); Tetsuya Aihara, Yokkaichi (JP); Hiroshi Nakano, Yokkaichi (JP); Shigeki Shimada, Osaka (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/663,770

(22) PCT Filed: Sep. 27, 2005

(86) PCT No.: PCT/JP2005/017737

§ 371 (c)(1),
(2), (4) Date: Sep. 28, 2007

(87) PCT Pub. No.: WO2006/035767

PCT Pub. Date: Apr. 6, 2006

(65) Prior Publication Data

US 2008/0085616 A1    Apr. 10, 2008

(30) Foreign Application Priority Data

Sep. 29, 2004    (JP)    ............... 2004-313086

(51) Int. Cl.
*H01R 12/00*    (2006.01)
(52) U.S. Cl. .................. 439/83; 439/569; 439/663; 439/541.5; 439/567

(58) Field of Classification Search .............. 439/83, 439/569, 663, 541.5, 567
See application file for complete search history.

(56) References Cited

U.S. PATENT DOCUMENTS 4,668,040 A * 5/1987 Matsuzaki et al. .......... 439/571
6,053,767 A * 4/2000 Copper et al. ............... 439/567

FOREIGN PATENT DOCUMENTS

| JP | A 4-163875   | 6/1992  |
| JP | A 5-326049   | 12/1993 |
| JP | A 6-203896   | 7/1994  |
| JP | A 9-171857   | 6/1997  |
| JP | A 2000-067963 | 3/2000 |

* cited by examiner

*Primary Examiner*—Truc T Nguyen
(74) *Attorney, Agent, or Firm*—Oliff & Berridge, PLC

(57) ABSTRACT

A plurality of terminal fittings 11 are mounted to a housing 20, board connecting portions 13 having mounting portions 14 at lower ends protrude rearward, fixed fittings 30 having mounting plates 32 at lower edges are mounted to opposite side surfaces of the housing 20, and the mounting portion 14 of each terminal fitting 11 and the mounting plates 32 of the fixed fittings 30 are secured to a PCB 40 by reflow soldering. During the reflow soldering, a drawing force toward the PCB 40 acts on each of the terminal fittings 11 and the fixed fittings 30 based on surface tension of molten solder H, but the center of the fixed fitting 30 in the fore/aft direction of the board connecting portion 13 is positioned forward of the center of gravity position O of a connector 10, and rotation moment Mb toward the PCB 40 acts on the front of the housing 20 based on a drawing force Fb on the side of the fixed fitting 30 to prevent the front from being raised.

14 Claims, 8 Drawing Sheets

BOARD CONNECTOR

TECHNICAL FIELD

The present invention relates to a connector secured to a board by reflow soldering.

BACKGROUND ART

An example of a board connector has been known as disclosed in Japanese Patent Laid-Open No. 5-326049. In securing a housing of the connector mounted with a terminal fitting to a printed circuit board, board securing portions laterally extended are integrally formed at lower ends of opposite sides of the housing, and screws inserted from a back side of the circuit board are screwed into screw holes formed in the board securing portions.

DISCLOSURE OF THE INVENTION

However, it is difficult to secure such a connector to be secured to the circuit board by screwing, and the laterally extended board securing portions increase a space for placing the connector on the circuit board.

SUMMARY OF THE INVENTION

The present invention is completed based on the above described circumstances, and has an object to provide a connector that can be easily secured to a circuit board, and can be placed in a small space.

The present invention has a basic principle that a terminal fitting is connected to a circuit board by reflow soldering, a fixed fitting is mounted to a side surface of a housing, and the fixed fitting is simultaneously secured to the circuit board by reflow soldering. According to this method, the housing can be easily secured to the circuit board, and the space can be reduced.

Further, the present invention solves, in the following manner, a specific problem in simultaneous reflow soldering of the terminal fitting and the fixed fitting to the circuit board as described above.

For reflow soldering of such a connector to a circuit board, solder cream is printed at predetermined positions on the circuit board, and the connector is placed on the circuit board so that soldering portions of a terminal fitting and a fixed fitting come into contact on the solder cream, which is then generally heated to a solder melting temperature. Then, solder particles in the solder cream are molten to be molten solder, which adheres to the soldering portions of the terminal fitting and the fixed fitting in a raised manner by surface tension. Cooling this molten solder allows electrical connection of the terminal fitting and securing of the connector to be simultaneously performed.

However, if the fixed fitting is simply mounted to the housing, and the terminal fitting and the fixed fitting are reflow soldered to the circuit board, the front of the housing may be raised (the side opposite from the terminal fitting protruding) from the circuit board at completion of the soldering, even when it is horizontally placed on the circuit board.

The inventors have studied that the following phenomenon occurs to tilt the connector during reflow soldering of the connector. When the solder cream is molten during reflow soldering, the connector is temporarily raised on the molten solder. On the other hand, the surface tension of the molten solder causes a drawing force for the terminal fitting and the fixed fitting toward the circuit board.

At this time, the fixed fitting is placed on a side wall portion of the housing and near the center of gravity of the connector in the fore/aft direction, and thus a drawing force generated by the fixed fitting is distributed at the front and rear of the center of gravity to counteract most of rotation moment caused by the drawing force. On the other hand, the terminal fitting of the connector is soldered to the circuit board at a position protruding rearward from a rear end surface of the housing, and thus a drawing force acts on a position relatively rearward away from the center of gravity of the connector. Thus, rotation moment caused by the drawing force generated on the terminal fitting significantly acts to tilt the housing so that the rear wall thereof is lowered.

According to one embodiment of the present invention, the fixed fitting is mounted to the side wall portion of the housing so that the center (along the side wall portion) of the board securing portion (which is reflow soldered to the circuit board) is positioned on the side opposite from the rear wall portion of the housing relative to the center of gravity position of the connector. Thus, when the surface tension of the molten solder causes a drawing force to act on the board securing portion of the fixed fitting during reflow soldering of the terminal fitting and the fixed fitting, the force acts as the rotation moment for drawing the front surface of the housing downward, thereby allowing the rotation moment for drawing the rear wall of the housing downward caused by the terminal fitting to be counteracted, and preventing the front surface of the housing from being raised.

DESCRIPTION OF SYMBOLS

Figure 1:
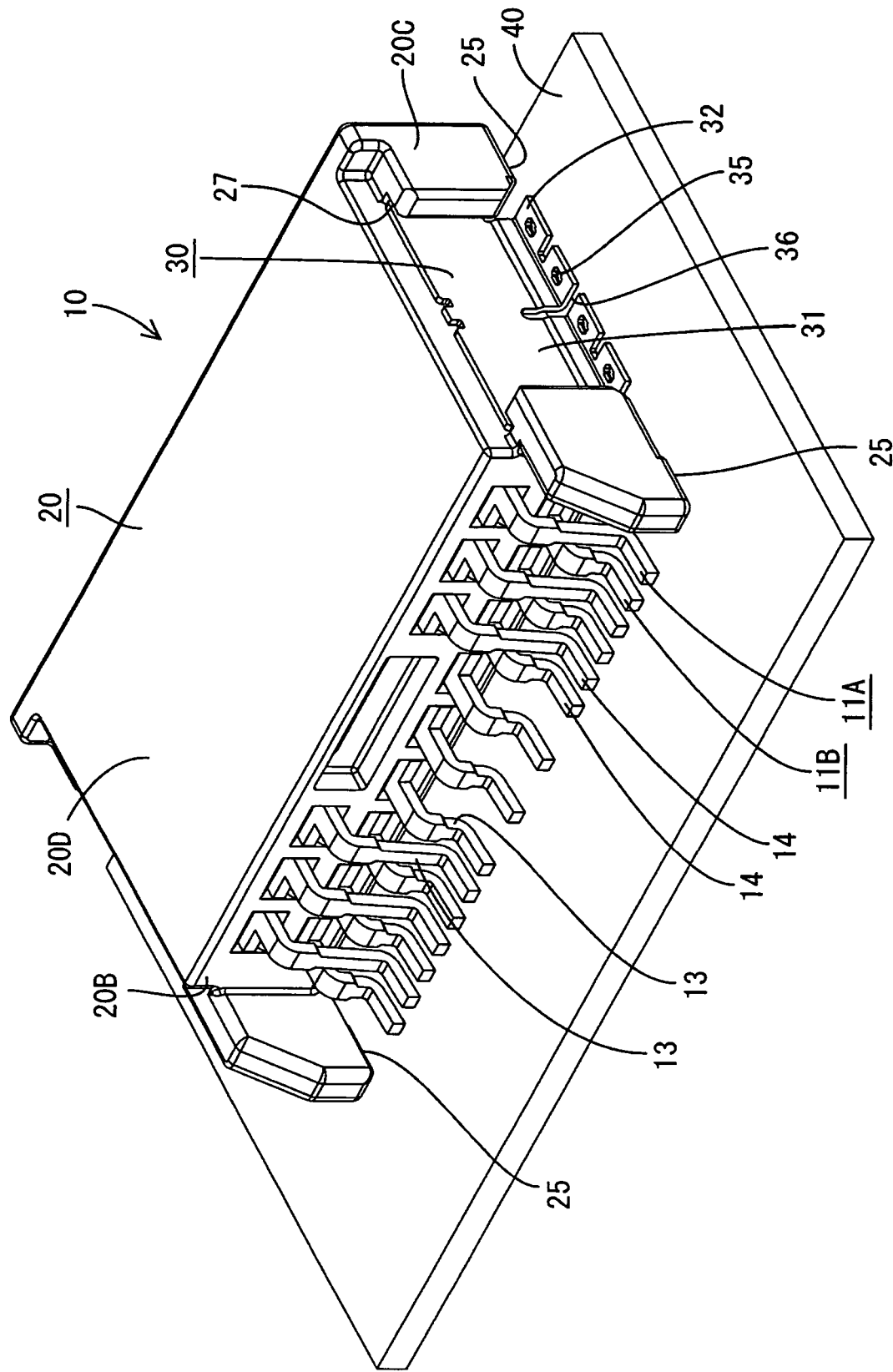
FIG. 1 is a perspective view of a connector according to one embodiment of the present invention being mounted on a PCB.

10 . . . board connector
11, 11A, 11B . . . terminal fitting
13 . . . board connecting portion
14 . . . mounting portion
20 . . . housing
20A . . . bottom wall portion
29B . . . rear wall portion
29C . . . side wall portion
25 . . . support protrusion
30 . . . fixed fitting
32 . . . board securing portion
35 . . . solder entering hole
36 . . . slit
40 . . . PCB (circuit board)
H . . . molten solder
O . . . the center of gravity position (of connector 10)

BEST MODE FOR CARRYING OUT THE INVENTION

One embodiment of the present invention will be described with reference to FIGS. 1 to 7.

As shown in FIG. 1, a board connector 10 of the embodiment is configured so that a plurality of terminal fittings 11 are mounted to a housing 20, the housing 20 is placed on a printed circuit board 40 (hereinafter simply referred to as a PCB 40), each terminal fitting 11 is connected to the PCB 40 by reflow soldering, fixed fittings 30 are mounted to opposite side surfaces of the housing 20, and the fixed fittings 30 are also secured on the PCB 40 by reflow soldering.

Figure 2:
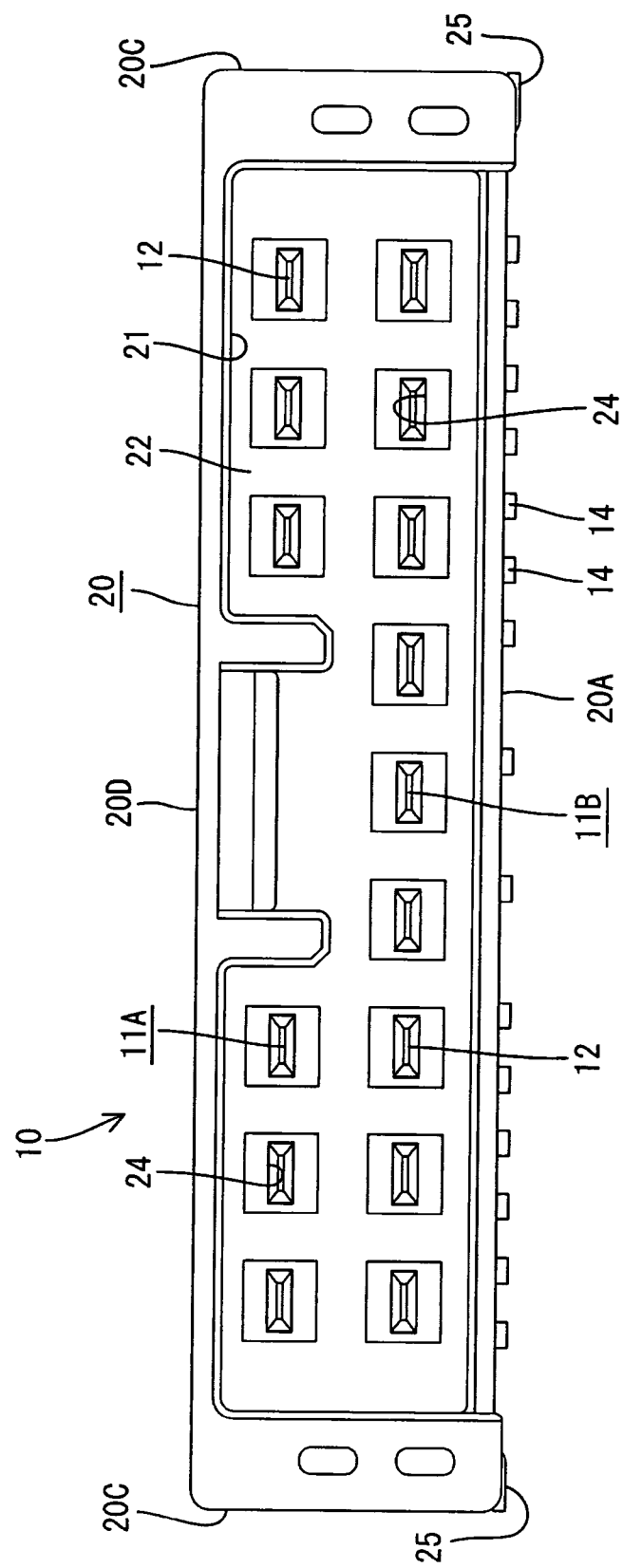
FIG. 2 is a front view of the connector.
Figure 3:
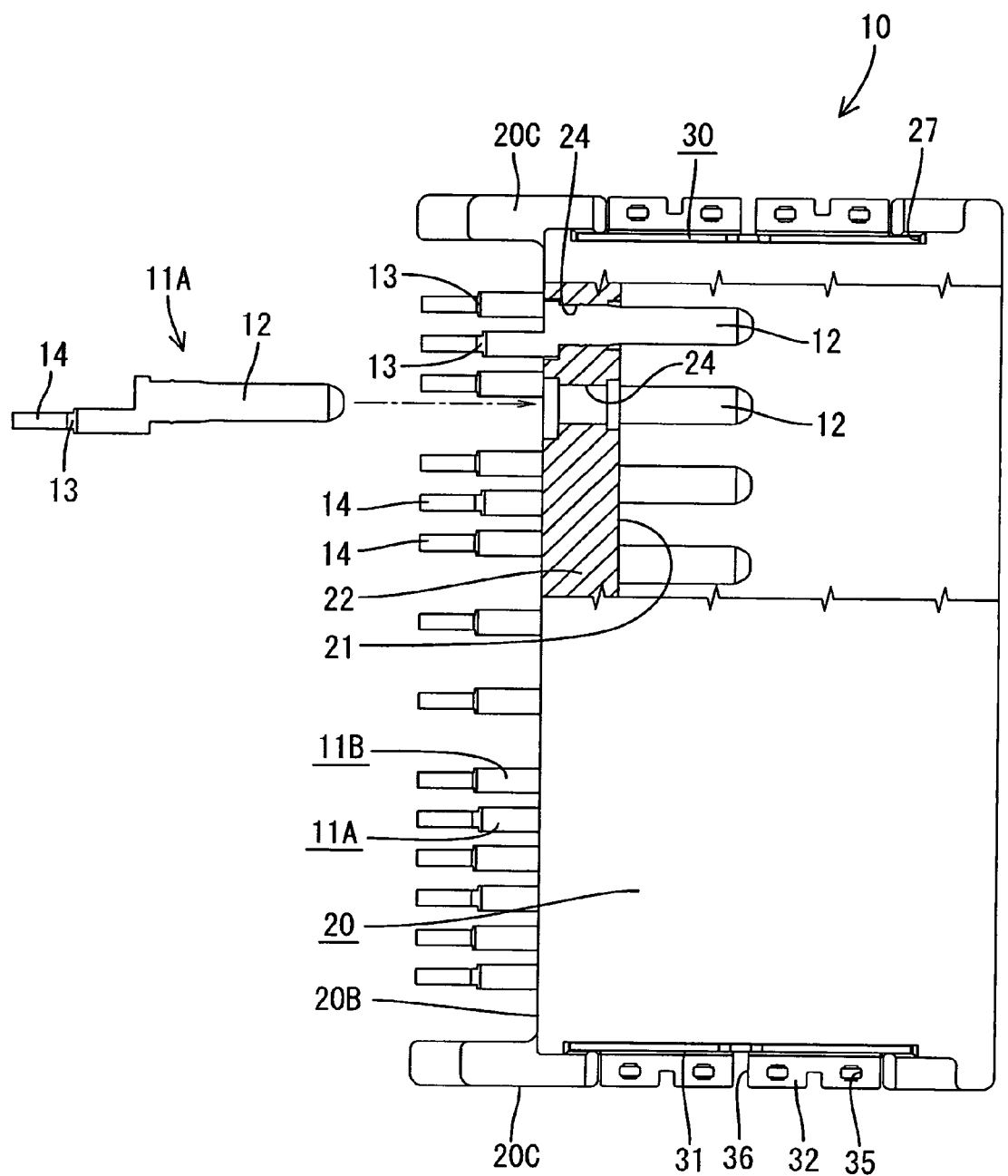
FIG. 3 is a fragmentary plan view thereof.

The housing 20 is made of synthetic resin, and is formed into a generally flat and horizontally oriented rectangular shape with one opened surface as shown in FIGS. 2 and 3. The housing 20 includes a bottom wall portion 20A placed on the PCB 40, a rear wall portion 20B perpendicularly connected to the bottom wall portion 20A, two sidewall portions 20C perpendicularly connected to the bottom wall portion 20A and positioned on right and left sides of the rear wall portion 20B, and a ceiling wall portion 20D substantially parallel to the bottom wall portion 20A and connected to the rear wall portion 20B and the side wall portions 20C, and has, at a front surface thereof, a fitting recess 21 to which a female counterpart housing (not shown) is fitted. At four corners of the bottom wall portion 20A, rectangular support protrusions 25 are formed that slightly protrude and have flat tip surfaces (lower surfaces).

In a rear wall portion 22 of the housing 20 that is a back wall of the fitting recess 21, a plurality of press fitting holes 24 are formed in line along the width in two upper and lower rows. Terminal connecting portions 12 of the terminal fittings 11 are press fitted into the press fitting holes 24 from the rear as described below. For example, three press fitting holes 24 are formed at regular intervals at each end along the width in the upper row, while for example, nine press fitting holes 24 are formed at regular intervals along the entire width in the lower row, and three holes at each end in the upper row and three holes at each end in the lower row are vertically aligned.

The terminal fittings 11 include tall first terminal fittings 11A and short second terminal fittings 11B, and fifteen terminal fittings in total are provided. Each terminal fitting 11 is basically stamped and formed from copper alloy material by a press, and has, at one end, the terminal connecting portion 12 connected to a female terminal (not shown) mounted to the counterpart housing, and at the other end, a board connecting portion 13 connected to a land (not shown) on the PCB 40 by soldering.

The board connecting portion 13 is relatively formed into a narrow shape with about half the width of the terminal connecting portion 12, and has, at a lower end, a mounting portion 14 substantially perpendicularly bent rearward. In the first terminal fitting 11A, the board connecting portion 13 is formed from a position offset to the right relative to an axis of the terminal connecting portion 12 when seen from the rear in a rear end surface of the terminal connecting portion 12, while in the second terminal fitting 11B, the board connecting portion 13 is formed from a position offset to the left.

The terminal connecting portion 12 of the second terminal fitting 11B is press fitted from the rear into the press fitting hole 24 in the lower row, and then the terminal connecting portion 12 of the first terminal fitting 11A is press fitted into the press fitting hole 24 in the upper row. Thus, as shown in FIG. 3, the terminal connecting portions 12 of the upper and lower terminal fittings 11A and 11B protrude with the same length in the fitting recess 21 of the housing 20, and the mounting portions 14 in the board connecting portions 13 of the upper and lower terminal fittings 11A and 11B are horizontally arranged in line at a position protruding rearward of the housing 20 by a predetermined length.

Fixed fittings 30 are mounted to the side walls 20C on the right and left of the housing 20, the fixed fittings 30 also secure the housing 20 on the PCB 40 by soldering.

Figure 4:
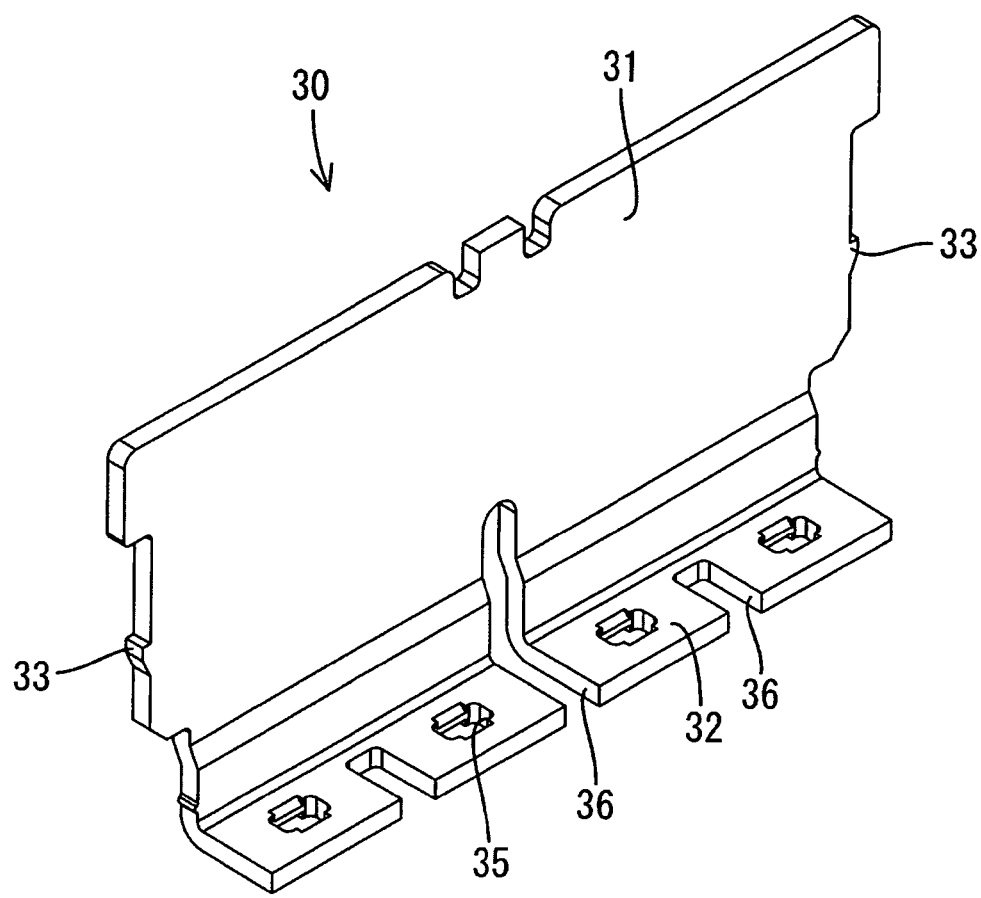
FIG. 4 is a perspective view of a fixed fitting.
Figure 5:
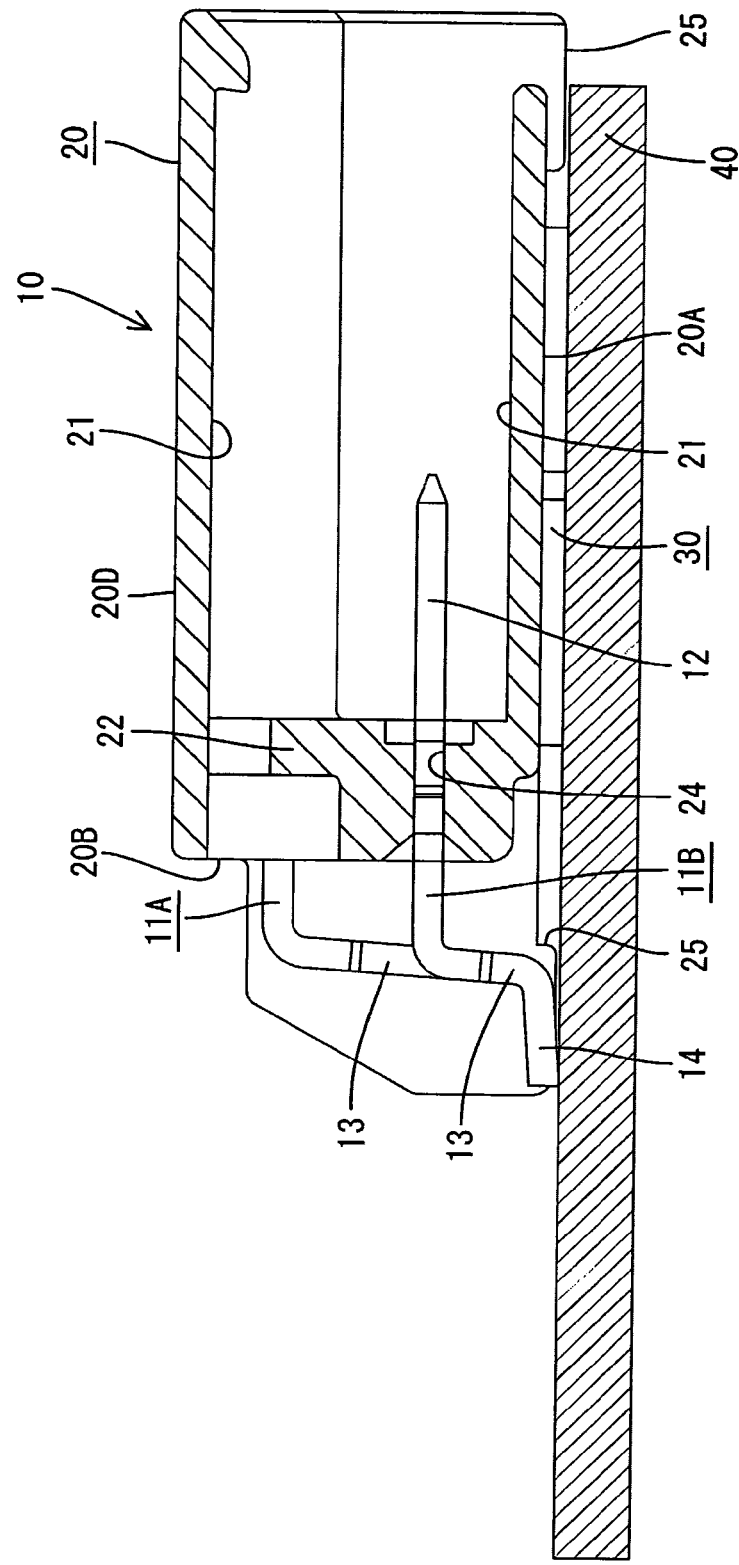
FIG. 5 is a vertical sectional view of a connector being mounted on a PCB.
Figure 6:
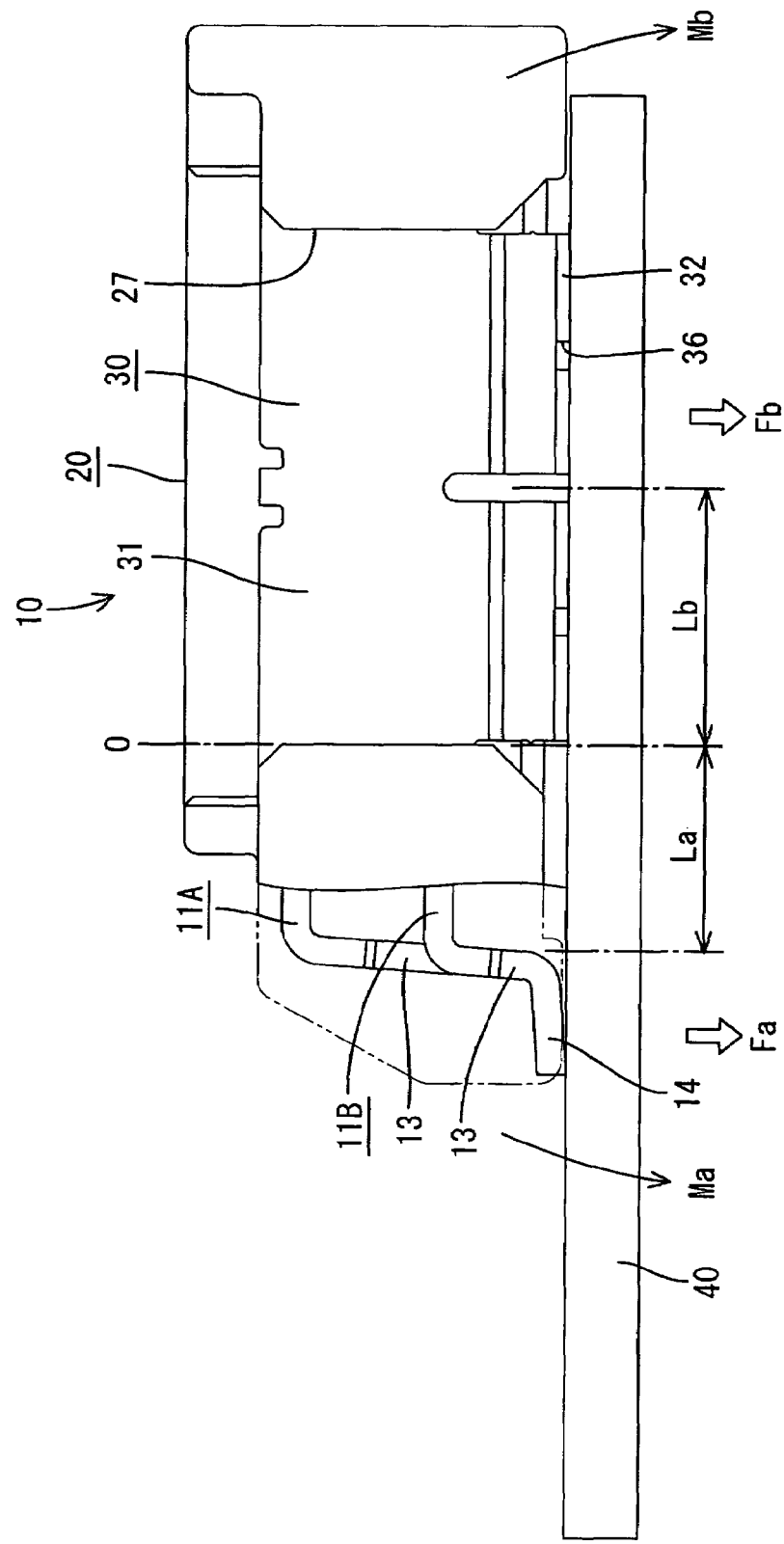
FIG. 6 is a fragmentary side view thereof.

Each fixed fitting 30 is formed by pressing a metal plate, the fixed fitting 30 including a housing securing portion 31 mounted to the side surface of the housing 20, and a board securing portion 32 integrally perpendicularly bent from a lower edge of the housing securing portion 31 and positioned on the PCB 40 as shown in FIG. 4.

The housing securing portion 31 has three steps with decreasing widths from the upper portion toward the lower portion, and has engaging protrusions 33 at opposite edges in the middle step. The opposite side walls 20C of the housing 20 each have a mounting groove 27 into which the housing securing portion 31 of the fixed fitting 30 can be inserted from above.

The fixed fitting 30 is inserted, at the housing securing portion 31, into the mounting groove 27 from above, pushed into the mounting groove 27 while the engaging protrusions 33 engage side edges of the mounting groove 27, stopped at a predetermined position, and retained and mounted so that a lower surface of the board securing portion 32 slightly protrudes downward from a lower surface of the bottom wall portion 20A of the housing 20 to be flush with a lower surface of the support protrusion 25, though not shown in detail.

The board securing portion 32 of the fixed fitting 30 is retained at a depth slightly protruding from the side wall portion 20C of the housing 20 when inserted into the mounting groove 27. The board securing portion 32 is shown with four solder entering holes 35 formed at regular intervals along the length, and slits 36 perpendicular to the length of the board securing portion 32 are formed between the solder entering holes 35 and the middle slit 36 is formed to be raised from the board securing portion 32 to a lower end of the housing securing portion 31.

The fore/aft mounting position of the fixed fitting 30 having the above described configuration is determined so that the center of the board securing portion 32 along the side wall portion 20C is positioned forward of the center of gravity position (denoted by reference character O in FIG. 6) of the connector 10 (that is, the side opposite from the rear wall portion 20B of the housing 20).

More specifically, in the embodiment, when a distance La from the center of gravity position O to a root of the mounting portion 14 of the terminal fitting 11 is 3.0 mm, a distance Lb from the center of gravity position O to the center of the fixed fitting 30 is set to 5.0 mm.

The above described connector 10 is mounted on the PCB 40 by reflow soldering by the following procedure:

Portions to be soldered on the surface of the PCB 40 are provided with copper foil (not shown), and solder cream for reflow soldering is previously adhered to the foil. Then, the connector 10 is placed at a predetermined position on the surface of the PCB 40, thus the mounting portion 14 of each terminal fitting 11 is placed over the solder cream, and the board securing portions 32 of the fixed fittings 30 are also placed over the solder cream.

When the PCB 40 on which the connector 10 is placed is moved into a high temperature furnace (not shown) in this state, solder in the solder cream previously coated on the PCB 40 is molten to form a molten solder layer, which adheres to the mounting portion 14 of each terminal fitting 11 and the board securing portions 32 of the fixed fittings 30. When the PCB 40 is moved out of the high temperature furnace to cool the molten solder, the mounting portion 14 of each terminal fitting 11 is secured on the copper foil on the PCB 40 and conductively connected. The board securing portions 32 of the fixed fittings 30 are also secured to separate copper foil on the PCB 40, that is, the housing 20 is mounted to the PCB 40.

Figure 7:
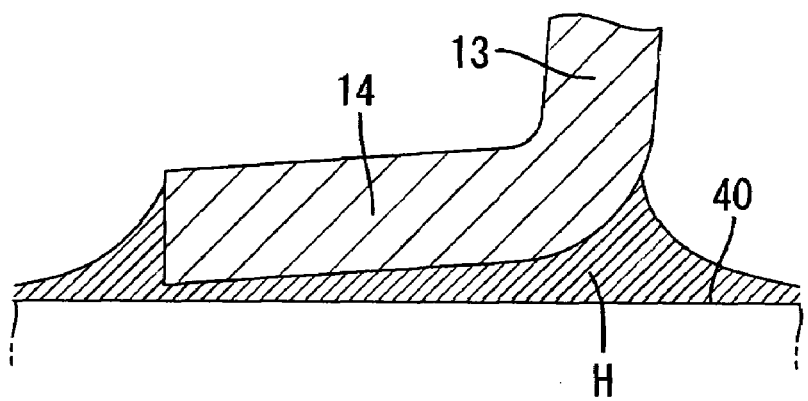
FIG. 7 is a partial sectional view of an adhering state of solder on a terminal fitting.

For the adhering state of the solder, the solder H adheres along a peripheral edge of each mounting portion 14 in a raised manner on the side of the terminal fitting 11 as shown in FIG. 7, and a component of force of the surface tension that acts at this time causes a drawing force for the mounting portion 14 toward the PCB 40. The drawing force for one mounting portion 14 is, for example, about 0.8 (N/m), and thus a drawing force Fa for fifteen terminal fittings 11 is Fa=0.8 (N/m)*15=12 (N/m).

Figure 8:
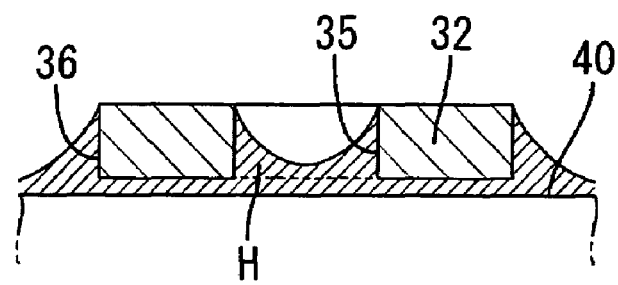
FIG. 8 is a partial sectional view of an adhering state of solder on a fixed fitting.

On the other hand, on the side of the fixed fitting 30, as shown in FIG. 8, the solder H adheres to the peripheral edge of the divided board securing portion 32 and the peripheral edge of the solder entering hole 35 in a raised manner, and a component of force of the surface tension that acts at this time similarly causes a drawing force for the board securing portion 32 toward the PCB 40. The drawing force for one board securing portion 32 is, for example, about 8.0 (N/m), and thus a drawing force Fb for two right and left fixed fittings 30 is Fb=8.0 (N/m)*2=16 (N/m).

Further, based on the drawing forces, rotation moment Ma of the terminal fitting 11 toward the PCB 40 at the rear of the housing 20, and rotation moment Mb of the front of the housing 20 toward the PCB 40 act, for example, with the center of gravity position O of the connector 10 at the center.

Specifically, the rotation moment Ma at the rear is Ma=Fa*La=12 (N/m)*3.0 (mm)=36.0 (N), and the rotation moment Mb at the front is Mb=Fb*Lb=16 (N/m)*5.0 (mm)=80.0 (N).

Thus, the rotation moment Ma at the rear is smaller than the rotation moment Mb at the front. In brief, a rotation force for pressing the front of the housing 20 against the PCB 40 with the center of gravity position O at the center more significantly acts on the housing 20, and thus the housing 20 is reliably secured on the PCB 40 without the front being raised.

The possible factors for increasing the rotation moment Mb at the front may be as follows:

First, the surface tension of the solder increases with increasing length of the portion at the peripheral edge to which the solder adheres in a raised manner. Thus, the board securing portion 32 of the fixed fitting 30 has the slits 36 and is divided, and has the solder entering holes 35. The solder adheres to the peripheral edge of the divided board securing portion 32 and the peripheral edge of the solder entering hole 35 in the raised manner, that is, the length of the peripheral edge to which the solder adheres in the raised manner is long, thereby increasing the surface tension. This allows the rotation moment Mb at the front to be increased.

The mounting position of the fixed fitting 30 is forward away from the center of gravity position O. This increases the length of a so-called arm for obtaining the rotation moment Mb at the front, thereby increasing the rotation moment Mb.

In the embodiment, the support protrusions 25 are provided at the four corners of the bottom wall portion 20A of the housing 20, and thus the contact positions of the housing 20 with the PCB 40 are determined at the four corners. Thus, the tilt of the housing 20 can be more reliably prevented in this embodiment. Without the support protrusions 25, the center (and therearound) of the bottom wall portion 20A of the housing 20 locally comes into contact with the surface of the PCB 40 depending on forming accuracy of the housing 20 or flatness of the surface of the PCB 40 to allow or facilitate the tilt of the housing 20.

In a connector of the type such that a terminal fitting is previously inserted and mounted into a cavity formed in a housing, there is a slight gap between an inner wall of the cavity and the terminal fitting for allowing insertion of the terminal fitting, and thus if surface tension when molten solder adheres to aboard connecting portion of the terminal fitting causes a drawing force to act on the terminal fitting, the terminal fitting is slightly moved and the drawing force does not act on the housing. On the other hand, if the terminal fitting 11 is not press fitted into the housing 20 as in this embodiment, the above described movement of the terminal fitting 11 is not allowed at all, and thus the drawing force that acts on the terminal fitting 11 immediately acts as the drawing force for the housing 20. However, as described above, the rotation moment for pressing the front of the housing 20 against the PCB 40 significantly acts in the embodiment, and thus the housing 20 is reliably secured on the PCB 40 without the front being raised.

The present invention is not limited to the embodiment described above with reference to the drawings, and the technical scope of the present invention covers, for example, the following embodiments.

(1) Numerical values of the surface tension or numerical values of the distance from the center of gravity position described in the embodiment are merely examples, and may be replaced by other numerical values.

(2) In the above described embodiment, the board securing portion 32 of the fixed fitting 30 has both the slit 36 and the hole 35, but the board securing portion 32 may have either or none of slit 36 and the hole 35.

The invention claimed is:

1. A board connector reflow soldered to a circuit board to be electrically connected and secured to a circuit board, comprising:
    a housing having a bottom wall portion placed on said circuit board, and a rear wall portion and a side wall portion connected to the bottom wall portion, the side wall portion defining a side of the board connector, the side having a length and a centerline defined midway across the length;
    a terminal fitting having, at an end, a board connecting portion soldered to said circuit board, and mounted to said housing with the board connecting portion protruding from the rear wall portion of said housing; and
    a fixed fitting having a board securing portion soldered to said circuit board, and mounted to the side wall portion of said housing, the board securing portion extending a substantial extent of the length of said side of said board connector,
    wherein the fixed fitting is mounted so that the center of said board securing portion along said side wall portion is positioned on the side opposite from the rear wall portion of said housing relative to the center of gravity position of said connector and part of the board securing portion extends over the centerline of the board connector on the side opposite from the rear wall portion of the housing.

2. The board connector according to claim 1, wherein said fixed fitting has a housing securing portion along said side wall portion, and said board securing portion integrally extended from the housing securing portion along said circuit board, and said board securing portion has a hole in contact with the circuit board.

3. The board connector according to claim 1, wherein the bottom wall portion of said housing has support protrusions extending outward laterally from the bottom wall portion at four corners.

4. The board connector according to claim 1, wherein said terminal fitting is press fitted through the rear wall portion of said housing from the rear and mounted to said housing.

5. The board connector according to claim 2, wherein the bottom wall portion of said housing has support protrusions extending outward laterally from the bottom wall portion at four corners.

6. The board connector according to claim 2, wherein said terminal fitting is press fitted through the rear wall portion of said housing from the rear and mounted to said housing.

7. The board connector according to claim 3, wherein said terminal fitting is press fitted through the rear wall portion of said housing from the rear and mounted to said housing.

8. The board connector according to claim 5, wherein said terminal fitting is press fitted through the rear wall portion of said housing from the rear and mounted to said housing.

9. The board connector of claim 3, wherein opposite sides of the fixed fitting are mounted to the side wall portion of the housing by the support protrusions.

10. A board connector comprising:
- a housing having a bottom wall portion connected to a circuit board, and a rear wall portion and a side wall portion connected to the bottom wall portion, the side wall portion defining a side of the board connector, the side having a length and a centerline defined midway across the length;
- a terminal fitting including a board connecting portion solder connected to the circuit board, wherein the terminal fitting is connected to the housing, further wherein the board connecting portion protrudes from the rear wall portion of said housing; and
- a fixed fitting having a board securing portion solder connected to the circuit board, wherein the fixed fitting is connected to the side wall portion of the housing, the board securing portion extending over a substantial extent of the length of said side of said board connector, further where the fixed fitting is connected so that a center of the board securing portion along the side wall portion is positioned on a side opposite from the rear wall portion of the housing relative to a center of gravity position of the board connector and part of the board securing portion extends over the centerline of said board connector on the side opposite from the rear wall portion of the housing.

11. The board connector according to claim 10, wherein said fixed fitting includes a housing securing portion positioned along said side wall portion, further wherein the board securing portion extends from the housing securing portion co-planar with the circuit board, and the board securing portion defines a hole in contact with the circuit board.

12. The board connector according to claim 10, wherein the bottom wall portion of the housing includes a plurality of support protrusions extending outward laterally from the bottom wall and positioned at the circuit board.

13. The board connector according to claim 10, wherein the terminal fitting is press fitted through the rear wall portion of the housing and connected to said housing.

14. The board connector of claim 12, wherein opposite sides of the fixed fitting are mounted to the side wall portion of the housing by the support protrusions.

* * * * *